United States Patent
Yano et al.

(10) Patent No.: US 7,321,511 B2
(45) Date of Patent: Jan. 22, 2008

(54) SEMICONDUCTOR DEVICE AND METHOD FOR CONTROLLING OPERATION THEREOF

(75) Inventors: Masaru Yano, Kawasaki (JP); Hideki Arakawa, Kawasaki (JP); Hidehiko Shiraiwa, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/316,800

(22) Filed: Dec. 22, 2005

(65) Prior Publication Data
US 2006/0256617 A1 Nov. 16, 2006

Related U.S. Application Data

(63) Continuation of application No. PCT/JP2004/019645, filed on Dec. 28, 2004.

(51) Int. Cl.
*G11C 16/04* (2006.01)
*H01L 29/788* (2006.01)

(52) U.S. Cl. .................... 365/185.13; 365/185.14; 257/315; 257/320

(58) Field of Classification Search ............ 365/185.13
See application file for complete search history.

(56) References Cited

U.S. PATENT DOCUMENTS

| | | | |
|---|---|---|---|
| 5,895,949 A * | 4/1999 | Endoh | 257/314 |
| 6,531,735 B1 | 3/2003 | Kamigaki et al. | |
| 7,078,762 B2 * | 7/2006 | Ishii et al. | 257/316 |
| 7,158,420 B2 * | 1/2007 | Lung | 365/185.3 |
| 7,184,318 B2 * | 2/2007 | Kurata et al. | 365/185.28 |
| 7,190,023 B2 * | 3/2007 | Kamigaki et al. | 257/316 |
| 2003/0155607 A1 | 8/2003 | Kamigald et al. | |
| 2004/0070026 A1 | 4/2004 | Kamigald et al. | |
| 2005/0029681 A1 * | 2/2005 | Ishii et al. | 257/900 |
| 2005/0127429 A1 * | 6/2005 | Otsuga et al. | 257/315 |

FOREIGN PATENT DOCUMENTS

JP 2001-156275 6/2001

OTHER PUBLICATIONS

Y. Sagao et al.; "90nm-node multi-level AG-AND type flash memory with cell size of true 2F2/bit and programming . . . ", 2003 IEDM Dig. Tech. papers, pp. 823-826, Dec. 8, 2003.
H. Kurata et al.; "Self-Boosted Charge Injection for 90nm-Node 4Gb Multi-level AG- . . . ", 2004 symposium on VLSI Circuits Digest of Technical Papers, pp. 72-73, Jun. 17, 2004.

* cited by examiner

*Primary Examiner*—Son L. Mai
(74) *Attorney, Agent, or Firm*—Ingrassia Fisher & Lorenz, PC

(57) ABSTRACT

A semiconductor device includes a semiconductor substrate, word lines, global bit lines, and inversion gates that form inversion layers serving as local bit lines in the semiconductor substrate. The inversion layers are electrically connected to the global bit lines and a memory cell uses the inversion layers as a source and a drain.

20 Claims, 7 Drawing Sheets

A-A'

SEMICONDUCTOR DEVICE AND METHOD FOR CONTROLLING OPERATION THEREOF

CROSS-REFERENCES TO RELATED APPLICATIONS

This is a continuation of International Application No. PCT/JP2004/019645, filed Dec. 28, 2004 which was not published in English under PCT Article 21(2).

BACKGROUND OF THE INVENTION

1. Field of the Invention

The present invention generally relates to a semiconductor device and a method of controlling the operation of a semiconductor device.

2. Description of the Related Art

Non-volatile memories are memory devices that store information as data and can hold the data in storage even after the power supply is cut off. Flash memories are rewritable non-volatile memories and typically include a floating gate through which electrons are injected or drawn out so as to perform writing or erasing.

Y. Sasago, et al, disclose an AG-AND-type flash memory that has a floating gate but does not have a diffusion layer in "90-nm-node multi-level AG-AND type flash memory with cell size of true 2F 2/bit and programming throughput of 10 MB/s (December 2003, Technical Digest, pp. 823-826)". FIG. 1 is a plan view of the memory array of an AG-AND flash memory for the 90-nm-node as disclosed in Y. Sasago, et al. FIG. 2A is a cross-sectional view of the memory array of FIG. 1 illustrating the voltage conditions at the time of programming. FIG. 2B is a cross-sectional view of the memory array of FIG. 1 illustrating the voltage conditions at the time of reading. FIG. 3 illustrates the AG-AND array structure as disclosed in Y. Sasago, et al.

Assist gates $AG_0$ through $AG_3$ are provided on a silicon substrate and an inversion layer (a channel) is formed on the substrate therebelow. Therefore, a diffusion layer does not exist in this structure. Word lines WL extend in a direction perpendicular to the assist gates AG. During a programming operation, voltages of 0V, 5V, 1V, and 8V are supplied to the assist gates $AG_0$, $AG_1$, $AG_2$, and $AG_3$, respectively, and a voltage of 18V is supplied to the word lines WL of a selected cell as shown in FIG. 2A.

A channel that serves as a source is formed under the assist gate $AG_1$ to which the voltage of 5V is applied and a channel that serves as a drain is formed under the assist gate $AG_3$ to which the voltage of 8V is applied. The channel under the assist gate $AG_2$ to which the voltage of 1V is applied becomes weak, so that the electric field on the boundary with the floating gate FG is intensified and the current is restricted. The voltage of 0V is applied to the assist gate on the left side of the assist gate $AG_1$ to which the voltage of 5V is applied, so that the channel is cut off to stop the current flow.

The electrons from the source pass through the channel below the assist gate $AG_1$, the floating gate FG of the cell, the assist gate $AG_2$, the floating gate FG of the selected cell, and the assist gate $AG_3$. Hot electrons are then injected into the floating gate of the selected cell, as the electric field on the boundary between the portion below the 1V-applied assist gate $AG_2$ and the floating gate on the drain side.

During a reading operation, a voltage of 5V is applied to the assist gates AG on both sides of the subject floating gate, so that channels are formed thereunder, as shown in FIG. 2B. One of the channels is used as a source and the other one is used as a drain. In this manner, reading of the subject floating gate FG is performed.

Japanese Unexamined Patent Publication No. 2001-156275 discloses an AG-AND flash memory formed with SONOS-type memory cells. In this structure, two assist gates are provided between two diffusion regions that serve as a source and a drain, and SONOS-type memory cells are formed between the assist gates. The source and the drain are interchanged so as to trap electrons in the two nitride film regions of the memory cells in the vicinities of the assist gates. In this manner, two bits can be stored at once.

In the conventional AG-AND flash memory, however, sector transistors (ST Tr) connected to select gate lines are necessary to connect local bit lines to global bit lines $DL_{m-3}$ through $DL_{m+2}$. As a result, a larger circuit size is required. Also, with the technique disclosed by Y. Sasago, et al., there is a problem that the memory array area increases as the source and drain are formed without diffusion layers.

SUMMARY OF THE INVENTION

It is therefore an object of the present invention to provide a semiconductor device and a method for controlling the operation of the semiconductor device in which the above disadvantage is eliminated.

A more specific object of the present invention is to provide a semiconductor device that can limit the increase in circuit size, and a method of controlling the operation of such semiconductor device.

The above objects of the present invention are achieved by a semiconductor device that includes: a semiconductor substrate; word lines; global bit lines; inversion gates that form inversion layers serving as local bit lines in the semiconductor substrate, the inversion layers being electrically connected to the global bit lines; and a memory cell using the inversion layers as a source and a drain. In accordance with the present invention, the inversion gates can function as sector transistors and, therefore, there is no need to employ sector transistors. In this structure, the space required for sector transistors can be eliminated, and an increase in circuit size can be limited. In this manner, an array structure that includes a decoding circuit for minimizing the array size can be provided.

The inversion layers are preferably connected to the global bit lines via metal interconnections. The memory cell is formed between adjacent inversion gates. The semiconductor device of the present invention further includes a select circuit that supplies the inversion gates with a given voltage for programming or erasing. The inversion gates include a first inversion gate forming an inversion layer serving as the source, a second inversion gate forming an inversion layer serving as the drain, and a third inversion gate provided between the first and second inversion gates. The semiconductor device further includes a select circuit that supplies, at the time of writing, the first through third inversion gates with given voltages so that a memory cell to be subjected to writing can be selected.

The select circuit supplies, at the time of writing, the third inversion gate with a voltage weakening a channel formed between the source and drain in the semiconductor substrate. More specifically, the transistors of the inversion gates are slightly turned on, so that the channel under the third inversion gate among the channels formed between the source and drain in the semiconductor substrate can be weakened.

The inversion gates further include a fourth inversion gate that is provided at a side of the first inversion gate opposite to a side thereof at which the third inversion gate is provided, and the select circuit supplies, at the time of writing, the fourth inversion gate with a voltage that cuts a channel formed in the semiconductor substrate. More specifically, the transistors of the inversion gates are turned off, so that the channel formed in the semiconductor substrate can be cut. The semiconductor device of the present invention further includes a write voltage supply circuit that supplies, at the time of writing, the inversion layers with voltages for writing. The semiconductor device of the present invention also further includes a voltage supply circuit that supplies, at the time of erasing, the inversion layers and a word line with voltages for drawing out electrons injected in the memory cell to the semiconductor substrate by virtue of the Fowler-Nordheim (FN) tunneling effect. The voltages for drawing electrons toward the semiconductor substrate in this application are preferably negative voltages.

The semiconductor device of the present invention further includes a voltage supply circuit that supplies, at the time of erasing, a word line with a voltage for drawing out electrons injected in the memory cell to the word line by virtue of the FN tunneling effect. In addition, the semiconductor device of the present invention includes a voltage supply circuit that supplies, at the time of erasing, the inversion layers and a word line with voltages for drawing out electrons injected in the memory cell to the inversion gates by virtue of the FN tunneling effect. The semiconductor device of the present invention also includes: column sets (i) that include the global bit lines; and a decoder connecting a given global bit line in each of the column sets to a respective page buffer (60-i) via a common select signal line (C).

The inversion layers are shared by multiple memory cells. Each memory cell stores two bits on both sides of an insulating layer that is interposed between adjacent inversion gates. The memory cell is of a SONOS type and the semiconductor device is preferably a semiconductor memory device.

The above objects of the present invention are also achieved by a method that includes the steps of: forming inversion layers serving as local bit lines in a semiconductor substrate; electrically connecting the inversion layers to global bit lines; and selecting a word line. In accordance with the present invention, the inversion gates can function as sector transistors and, therefore, there is no need to employ sector transistors. In this structure, the areas for sector transistor can be eliminated, thereby limiting an increase in circuit size. In this manner, an array structure that includes a decoding circuit for minimizing the array size can be provided.

The inversion gates include a first inversion gate forming an inversion layer serving as a source, a second inversion gate forming an inversion layer serving as a drain, and a third inversion gate provided between the first and second inversion gates. The step of forming includes supplying, at the time of writing, the first through third inversion gates with given voltages so that a memory cell to be subjected to writing can be selected. The step of forming also includes supplying, at the time of writing, the third inversion gate with a voltage weakening a channel formed between the source and drain in the semiconductor substrate.

The inversion gates further include a fourth inversion gate that is provided at a side of the first inversion gate opposite to a side thereof at which the third inversion gate is provided, and the step of forming includes supplying, at the time of writing, the fourth inversion gate with a voltage that cuts a channel formed in the semiconductor substrate. The method further includes the step of programming portions of an insulating layer located at both sides of the third inversion gate in which each of the portions stores one bit.

In addition, the method includes the step of supplying, at the time of writing, the inversion layers with a write voltage via the global bit lines. The method also includes the step of supplying, at the time of erasing, the inversion layers and a word line with voltages for drawing out electrons injected in the memory cell to the semiconductor substrate by virtue of an FN tunneling effect. The voltages for drawing electrons toward the semiconductor substrate are preferably negative voltages.

Therefore, in accordance with the present invention, a semiconductor device that can limit an increase in circuit size and a method of controlling the operation of the semiconductor device can be provided.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
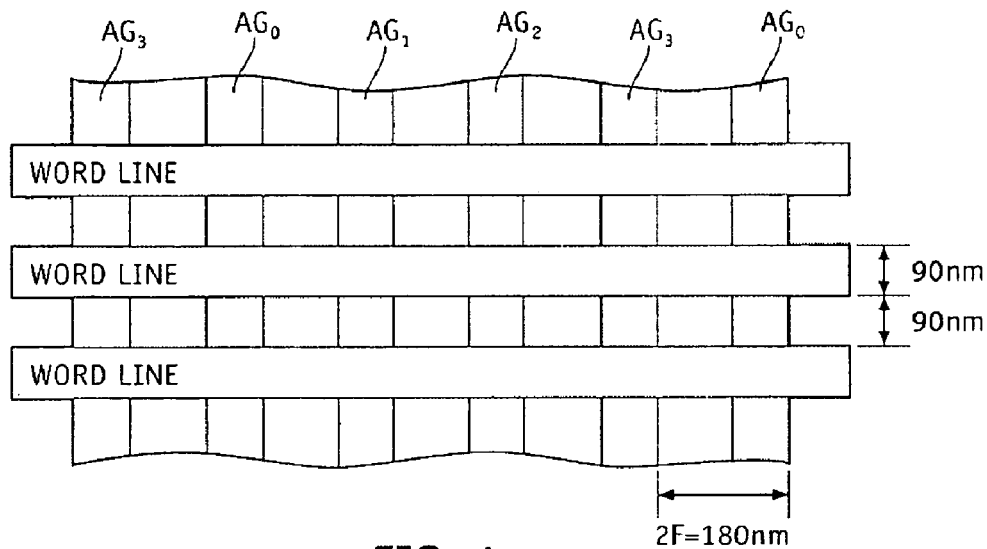
FIG. 1 illustrates a memory array of a conventional AG-AND flash memory.
Figure 2A:
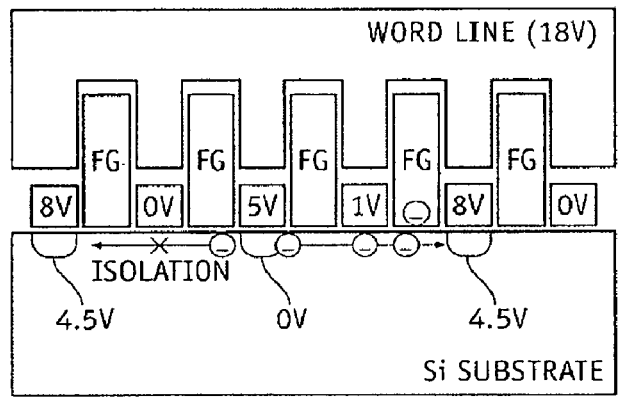
FIG. 2A is a cross-sectional view of the memory array of FIG. 1 showing the voltage conditions for programming.
Figure 2B:
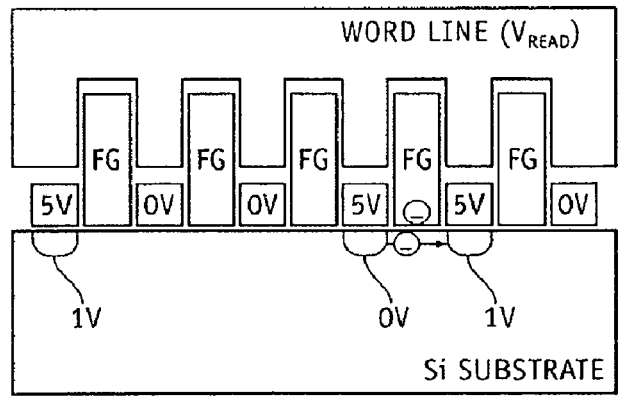
FIG. 2B is a cross-sectional view of the memory array of FIG. 1 showing the voltage conditions for reading.
Figure 3:
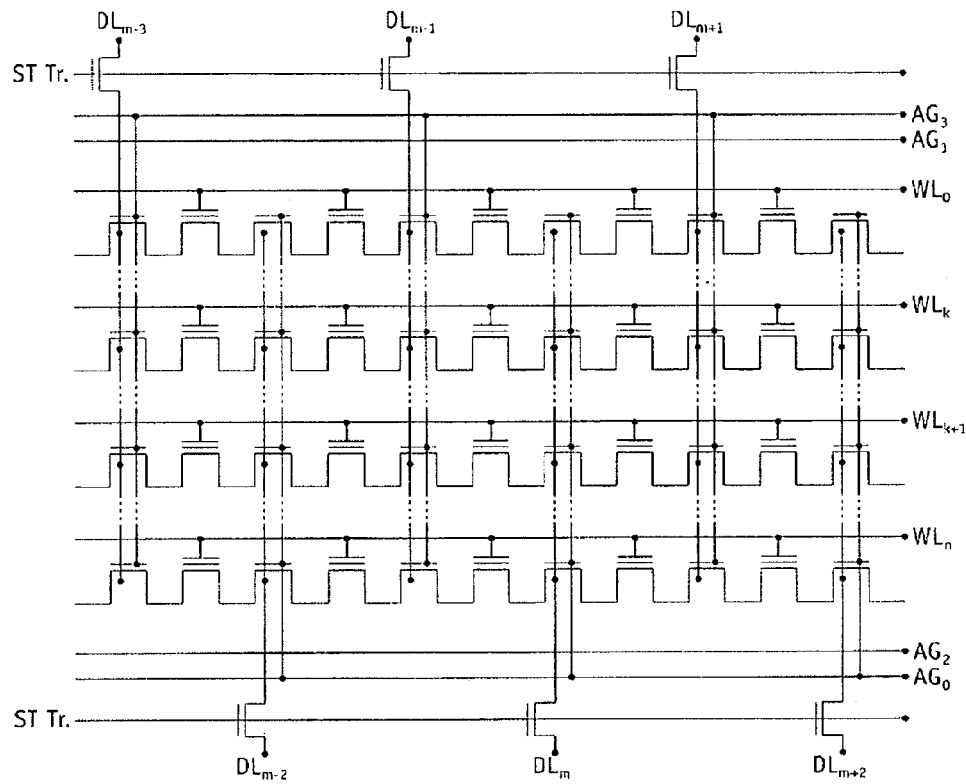
FIG. 3 illustrates a conventional AG-AND array structure.
Figure 4:
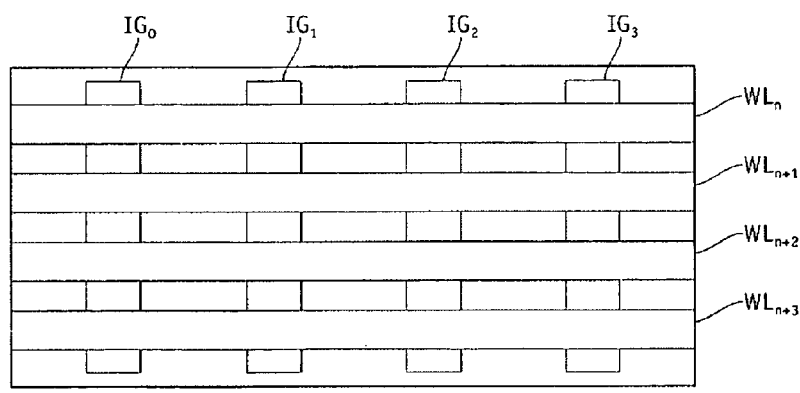
FIG. 4 is a plan view of the memory array of a semiconductor memory device in accordance with an embodiment of the present invention.
Figure 5:
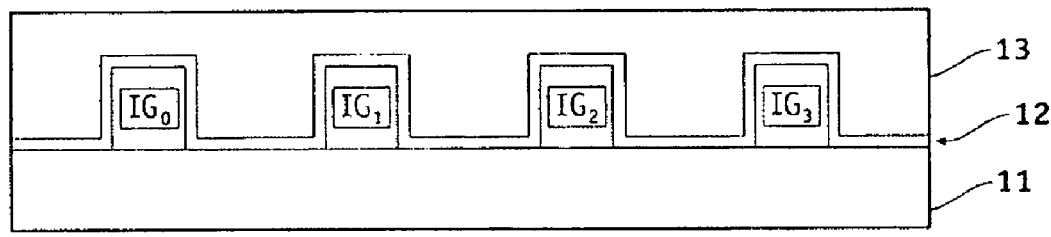
FIG. 5 is a cross-sectional view of the memory array, taken along a word line of FIG. 4 in accordance with an embodiment of the present invention.

The following is a detailed description of preferred embodiments of the present invention, with reference to the accompanying drawings. FIG. 4 is a plan view of the memory array of a semiconductor memory device in accordance with an embodiment of the present invention. FIG. 5 is a cross-sectional view of the memory array of FIG. 4, taken along a word line of FIG. 4. As shown in FIG. 4, word lines WL extend in a direction perpendicular to inversion gates $IG_0$ through $IG_3$. The inversion gates $IG_0$ through $IG_3$ form inversion layers (channels) to function as local bit lines in a semiconductor substrate, and electrically connect the inversion layers to global bit lines. In other words, the inversion gates $IG_0$ through $IG_3$ serve as the same components as conventional sector transistors.

As shown in FIG. 5, each memory cell has a SONOS (silicon-oxide-nitride-oxide-silicon) structure. Part of the surface of the semiconductor substrate 11 and the inversion gates $IG_0$ through $IG_3$ are covered with an ONO film 12 having a structure in which an oxide film, a nitride film, and an oxide film are stacked in this order. A polysilicon gate electrode 13 that is to serve as a word line $W_3$ is formed on the ONO film 12. Predetermined voltages are applied to the inversion layers to serve as sources and drains of the memory cells, so as to increase the gate voltage. By doing so, channels are formed. Each memory cell with the SONOS structure can store two bits by writing binary information in the gate insulation films in the vicinities of both electrodes serving as the source and the drain. In doing so, the charge injection to the gate insulating films is performed by interchanging the bias direction for bias application to both electrodes serving as the source and drain. In short, each memory cell stores one bit at either end of the insulating film between the inversion gates, thereby storing two bits in total.

Figure 6A:
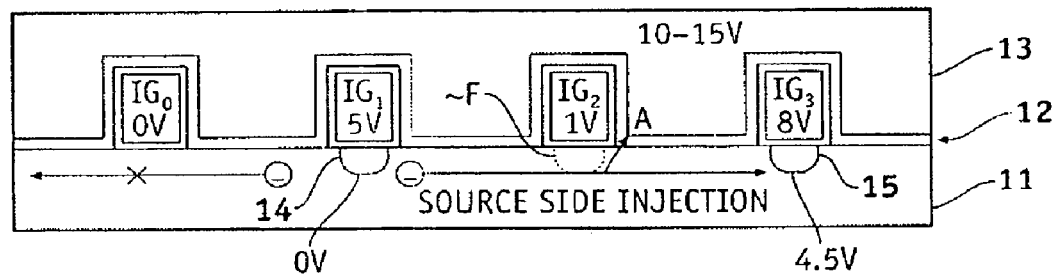
FIGS. 6A and 6B are schematic cross-sectional views illustrating the programming operation of a semiconductor memory device in accordance with an embodiment the present invention.
Figure 6B:
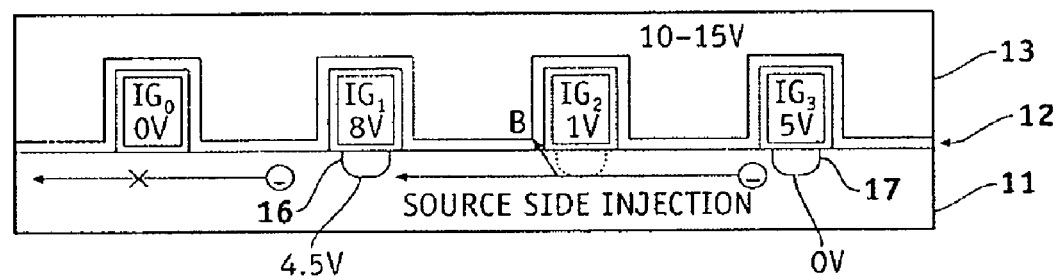

FIGS. 6A and 6B are schematic cross-sectional views illustrating the programming operation of a semiconductor memory device in accordance with this embodiment. In the example shown in FIGS. 6A and 6B, writing is performed in each memory cell through "source-side injection". "Source-side injection" is an operation of injecting electrons in the region located on the source side of a gate insulating film between two adjacent inversion gates. As shown in FIG. 6A, during a left-bit programming operation, voltages of 0V, 5V, 1V, and 8V are applied to the inversion gates $IG_0$, $IG_1$, $IG_2$, and $IG_3$, respectively. A voltage of 10V to 15V is applied to the word line WL of the selected cell.

As the voltage of 5V is applied to the inversion gate $IG_1$ (the first inversion gate), an inversion layer (a channel) 14 to serve as a source is formed in the semiconductor substrate 11. As the voltage of 8V is applied to the inversion gate $IG_3$ (the second inversion gate), an inversion layer (a channel) 15 to serve as a drain is formed in the semiconductor substrate 11. As the voltage of 1V is applied to the inversion gate $IG_2$ (the third inversion gate), the channel formed below the inversion gate $IG_2$ is weakened, and the electric field on the boundary is intensified while the current on the boundary is restricted. The voltage of 0V is applied to the inversion gate $IG_0$ (the fourth inversion gate), so that the channel is cut to stop the current flow. A voltage of 0V is applied to the inversion layer 14 and a voltage of 4.5V is applied to the inversion layer 15 so that electrons move from the source 14 toward the drain 15 in the channel. As the electric field on the drain side below the inversion gate $IG_2$ becomes high, the electrons passing through the channel acquire high energy, turning into hot electrons. The hot electrons are partially trapped as bits A in the ONO film 12.

As shown in FIG. 6B, during a right bit programming operation, voltages of 0V, 8V, 1V, and 5V are applied to the inversion gates $IG_0$, $IG_1$, $IG_2$, and $IG_3$, respectively. A voltage of 10V to 15V is applied to the word line WL of the selected cell. As the voltage of 5V is applied to the inversion gate $IG_3$, an inversion layer 17 to serve as a source is formed in the semiconductor substrate 11. As the voltage of 8V is applied to the inversion gate $IG_1$, an inversion layer 16 to serve as a drain is formed in the semiconductor substrate 11. As the voltage of 1V is applied to the inversion gate $IG_2$, the channel formed below the inversion gate $IG_2$ is weakened and the electric field on the boundary is intensified while the current on the boundary is restricted. The voltage of 0V is applied to the inversion gate $IG_0$ so that the channel is cut to stop the current flow. A voltage of 0V is applied to the inversion layer 17 and a voltage of 4.5V is applied to the inversion layer 16 so that electrons move from the inversion layer 17 as the source toward the inversion layer 16 as the drain in the channel. As the electric field on the drain side below the inversion gate $IG_2$ becomes high, the electrons passing through the channel acquire high energy, turning into hot electrons. The hot electrons are partially trapped as bits B in the ONO film 12.

By applying the voltage of 1V to the inversion gate $IG_2$, the channel formed below the inversion gate $IG_2$ is weakened and the current flowing through the channel is restricted. Accordingly, the programming current can be restricted to 100 nA/cell or lower. In a conventional NOR type flash memory, a programming current of approximately 100 µA/cell needs to flow. In accordance with the present invention, the programming current can be reduced to by a factor of one hundred or more. Accordingly, one hundred times as many cells can be written at once, and one thousand bits can be programmed at once, thereby enabling high-speed writing.

Figure 7:
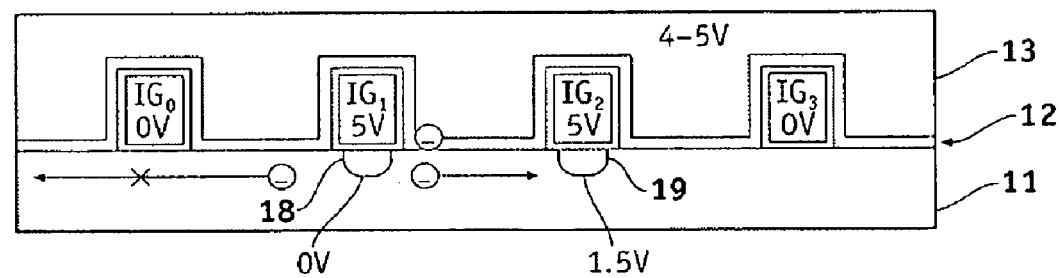
FIG. 7 is a schematic cross-sectional view illustrating the reading operation of the semiconductor memory device in accordance with the present invention.

FIG. 7 is a schematic cross-sectional view illustrating the reading operation of a semiconductor memory device in accordance with this embodiment. As shown in FIG. 7, during a reading operation, a voltage of 5V is applied to both the inversion gate $IG_1$ and the inversion gate $IG_2$, so that inversion layers 18 and 19 are formed in the semiconductor substrate 11 below the inversion gate $IG_1$ and the inversion gate $IG_2$, respectively. A voltage of 0V is applied to the inversion layer 18, a voltage of 1.5V is applied to the inversion layer 19, and a voltage of 4V to 5V is applied to the word line WL of the selected cell, thereby enabling data to be read from the subject cell.

Figures 8A, 8B:
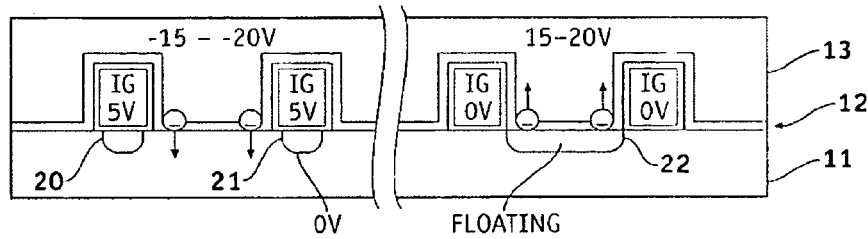
FIGS. 8A through 8C are schematic cross-sectional views illustrating the erasing operation of the semiconductor memory device in accordance with the present invention.
Figure 8C:
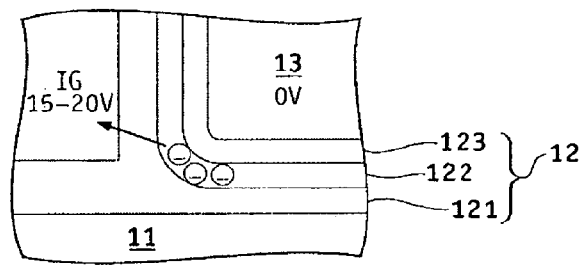

FIGS. 8A through 8C are schematic cross-sectional views illustrating the erasing operation of a semiconductor memory device in accordance with this embodiment. As shown in FIG. 8A, at the time of erasing, a voltage of 5V is applied to the inversion gates IG at both sides of the subject memory cell, so that inversion layers 20 and 21 are formed in the semiconductor substrate 11. A voltage of −15V to −20V is applied to the word line WL. The inversion layers 20 and 21 below the inversion gates IG are biased to 0V. Electrons injected in the ONO film 12 can be drawn out to the semiconductor substrate 11 by virtue of a Fowler Nordheim (FN) tunneling effect.

As shown in FIG. 8B, at the time of erasing, a voltage of 0V is applied to the inversion gates IG at both sides of the subject memory cell, and a voltage of 15V to 20V is applied to the word line WL. By doing so, the channel 22 is put into a floating state, with the inversion gates IG being at 0V. Accordingly, electrons injected in the ONO film 12 can be drawn out to the word line 13 by virtue of the FN tunneling effect.

As shown in FIG. 8C, at the time of erasing, a voltage of 15V to 20V is applied to the inversion gate IG and a voltage of 0V is applied to the word line WL. By virtue of field enhanced FN tunneling at a corner of the inversion gate IG, electrons injected in a nitride film 122 of the ONO film 12 (consisting of an oxide film 121, the nitride film 122, and an oxide film 123) may be drawn out to the inversion gate IG.

Figure 9:
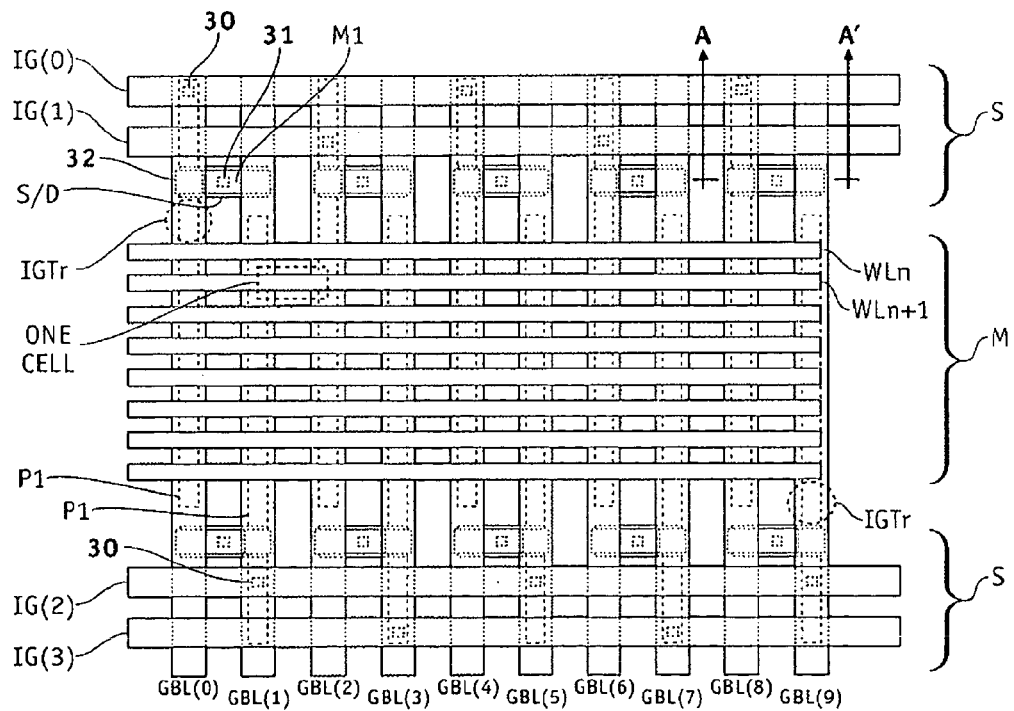
FIG. 9 is a layout of a core array in accordance with the present invention.
Figure 10:
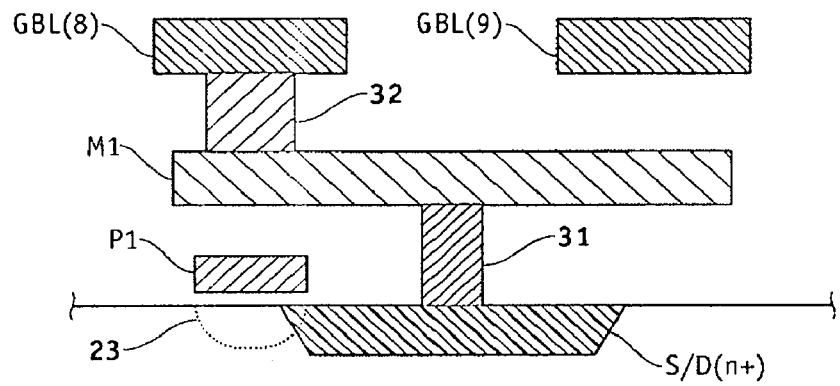
FIG. 10 is a cross-sectional view of the core array, taken along the line A-A' of FIG. 9.

FIG. 9 shows the layout of a core array in accordance with this embodiment. FIG. 10 is a cross-sectional view of the core array, taken along the line A-A' of FIG. 9. A semiconductor device in accordance with the present invention includes sector select regions and sector regions. In FIG. 9, the sector select regions are denoted by S, and a sector region that is formed with 4 Mb memory cells is denoted by M. IG(0) through IG(3) indicate inversion gate line patterns that are formed with metal lines, and GBL(0) through GBL(9) indicate global bit lines that are formed with metal lines. Memory cells are located in the regions in which the word lines WL intersect with the global bit lines GBL(0) through GBL(9) at right angles. Each memory cell is formed between two adjacent inversion gates. The portion surrounded by a dotted line is a unit cell.

In the semiconductor substrate, polysilicon members P1 serve as inversion gates to form the inversion layers serving as local bit lines and are formed in parallel with one another in conformity with the arrangement of the global bit lines GBL(0) through GBL(9). The inversion gate line patterns IG(0) through IG(3) are connected to the polysilicon members P1 via contacts 30. Predetermined voltages are applied to the inversion gate line patterns IG(0) through IG(3) so that inversion layers 23 that function as local bit lines are formed in the semiconductor substrate below the polysilicon members P1. The inversion layers 23 (FIG. 10) formed under the contacts 32 are connected to metal lines M1 via n+diffusion regions S/D and contacts 31. The metal lines M1 are electrically connected to the global bit lines GBL(0) through GBL(9) via contacts 32. The voltages shown in FIGS. 6A through 8C are applied to the global bit lines GBL(0) through GBL(9), the inversion gates IG, and the word lines WL. Thus, writing, reading, and erasing can be performed in the memory cells.

In this manner, the inversion gates IG function as switching transistors as denoted by IGTr and, accordingly, the inversion layers that function as the local bit lines LBL can be electrically connected to the global bit lines GBL(1) through GBL(9). In this structure, there is no need to employ sector transistors that have conventionally been required. Thus, the areas for sector transistors can be eliminated. In this manner, the height (the width of each portion denoted by S in FIG. 9) can be made 2 μm or smaller. As described above, a voltage of 1V is applied to each inversion gate IG so as to weaken the channel formed under the inversion gate IG and to restrict the current flowing through the channel. As a result, the programming current can be restricted to 100 nA/cell or lower. Even if the width W of each word line is small, the programming current required for writing can be supplied. Accordingly, the width W of each word line can be made 90 nm or smaller. Although the number of word lines in the example shown in FIG. 9 is 8, it may be also 128 or 256.

Figure 11:
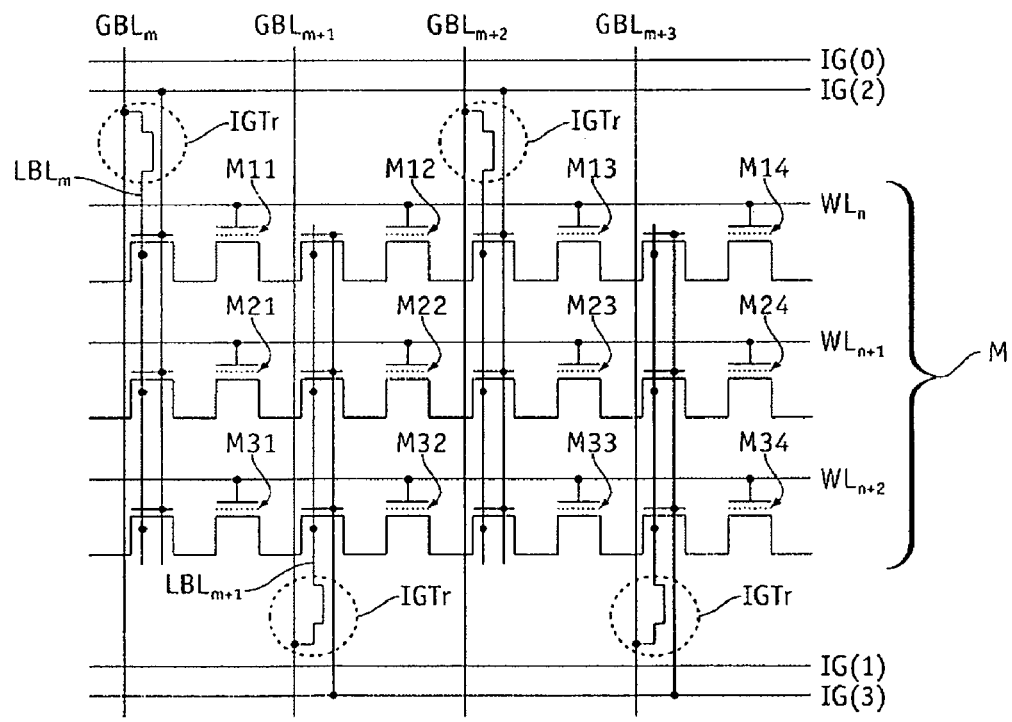
FIG. 11 is an equivalent circuit diagram of the core array of FIG. 9.

FIG. 11 is an equivalent circuit of the core array shown in FIG. 9. As shown in FIG. 11, the memory cell array M has memory cells M11 through Mnm arranged in a matrix fashion. The memory cells M11 through Mnm have ONO films. In the memory cell array M, each group of memory cells arranged in the row direction have gate electrodes connected to one of the word lines WL extending in the row direction in the memory cell array M. Also, each group of memory cells arranged in the column direction share an inversion layer that functions as a local bit line LBL. More specifically, the sources and drains of each group of memory cells arranged in the column direction are connected to one of the global bit lines GBL via the corresponding inversion layer that functions as a local bit line LBL formed with the corresponding inversion gate IG. The voltages shown in FIGS. 6A through 8C are applied to the global bit lines GBL(1) through GBL(9), the inversion gates IG, and the word lines WL. Thus, writing, reading, and erasing can be performed in the memory cells.

Since the inversion gates IG function as switching transistors denoted by IGTr, the inversion layers that function as the local bit lines LBL can be electrically connected to the global bit lines GBL. Accordingly, there is no need to employ sector transistors that have conventionally been required, and the areas for sector transistors can be omitted.

Figure 12:
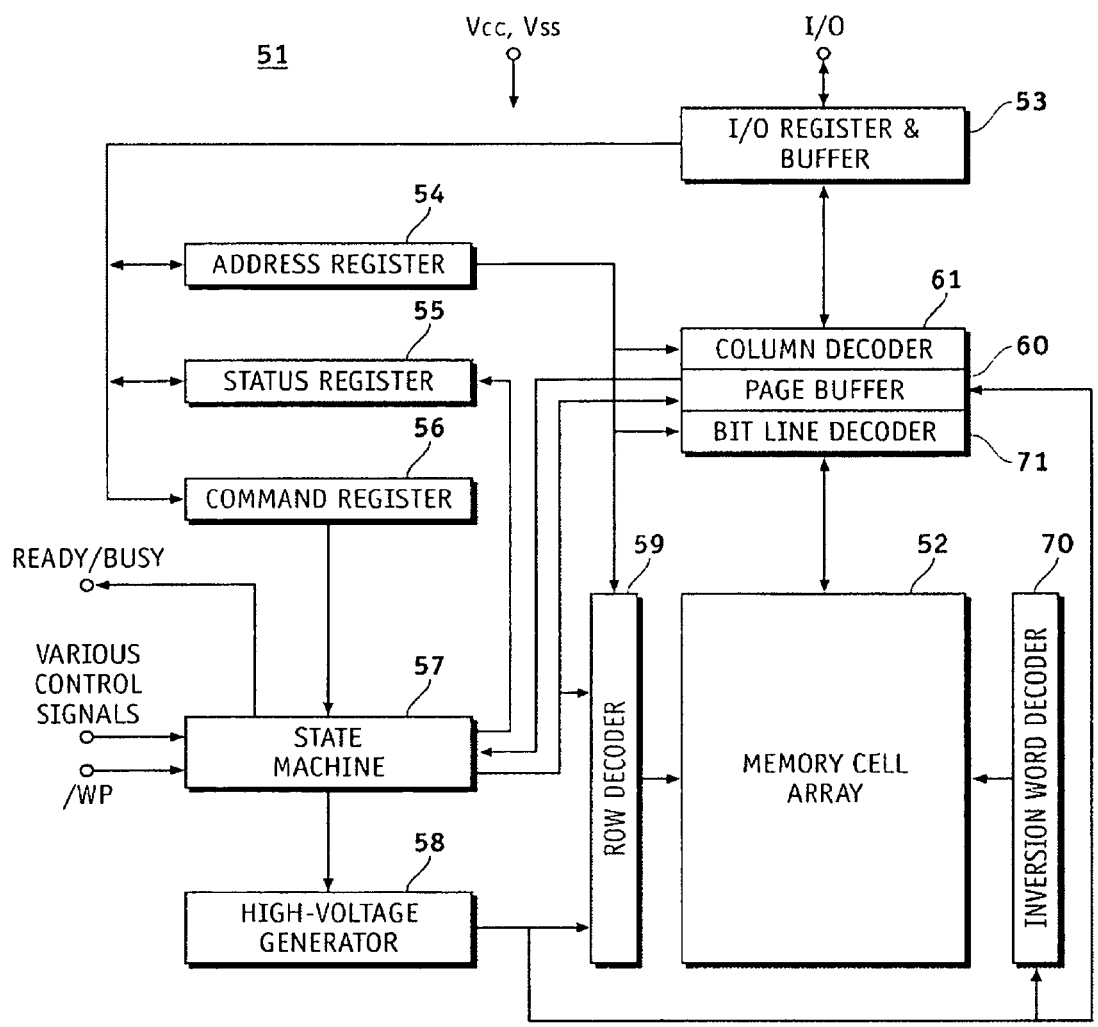
FIG. 12 is a block diagram of a semiconductor memory device in accordance with the present invention.

FIG. 12 is a block diagram of a semiconductor memory device in accordance with this embodiment. As shown in FIG. 12, a semiconductor memory device 51 includes a memory cell array 52, an input/output (I/O) register and buffer 53, an address register 54, a status register 55, a command register 56, a state machine 57, a high-voltage generating circuit 58, a row decoder 59, a page buffer 60, a column decoder 61, an inversion gate decoder 70, and a bit line (BL) decoder 71. The semiconductor memory device 51 may be incorporated into a semiconductor device.

The memory cell array 52 has rewritable non-volatile memory cell transistors arranged along word lines WL and bit lines BL that are arranged in a matrix fashion.

The I/O register and buffer 53 controls various signals or data in a similar manner to an I/O terminal. The address register 54 temporarily stores address signals that are input through the I/O register and buffer 53. The status register 55 temporarily stores status information, while the command register 56 temporarily stores operation commands that are input through the I/O register and buffer 53. The state machine 57 controls the operation of each circuit in the device in response to each control signal, so that the voltages shown in FIGS. 6A through 8C are applied to the respective components.

The high-voltage generating circuit 58 generates high voltages that are used in the device. The high voltages to be used in the device include a high voltage for writing data, a high voltage for erasing data, a high voltage for reading data, and a verifying high voltage for checking whether sufficient writing/erasing is performed in the memory cells at the time of writing or erasing data. Accordingly, the high-voltage generating circuit 58 supplies a write voltage to the inversion layers at the time of writing. Also, the high-voltage generating circuit 58 supplies a similar voltage at the time of erasing to the word lines that draws out the electrons injected into the memory cells toward the semiconductor substrate 11 by virtue of the FN tunneling effect. The high-voltage generating circuit 58 also supplies a similar high voltage to the word lines at the time of erasing that draws out the electrons injected into the memory cells toward the word lines by virtue of the FN tunneling effect. The high-voltage generating circuit 58 also supplies a high voltage to the inversion gates at the time of erasing that draws out the electrons injected into the memory cells by virtue of the FN tunneling effect.

The row decoder 59 decodes a row address that is input through the address register 54 and selects a word line WL in response to the decoded row address. The page buffer 60 includes a data latch circuit and a sense amplifier circuit. When reading the memory cells, the page buffer 60 collectively performs sensing and latching on data stored in memory cells connected to the same word line. At the time of writing, write data that is input through the I/O register and buffer 53 is successively latched in the latch circuit via the column decoder 61, and a write voltage is supplied to the memory cells in accordance with the latched data. The page buffer 60 is provided for data equivalent to one page (for example, 512 bytes).

The column decoder 61 decodes a column address that is input through the address register 54, selects data latched by the page buffers 60 at the time of reading each unit, and transfers the selected data to the I/O register and buffer 53. When writing, the column decoder 61 successively transfers write data that is input through the I/O register and buffer 53 to the latch circuit in the page buffer 60 for each unit. The I/O register and buffer 53, the row decoder 59, the column decoder 61, and the high-voltage generating circuit 58 operate under the control of the state machine 57.

The inversion gate decoder 70 supplies a predetermined voltage to the inversion gates IG and selects a memory cell in which writing or erasing is to be performed. Under the control of the address register 54, the inversion gate decoder 60 supplies a predetermined voltage signal to the inversion gates IG. In the sectors that remain unselected by the input address, a voltage of 0V is applied to the inversion gates $IG_0$ through $IG_3$. In the selected sector, voltages of 0V, 1V, 5V, and 8V are supplied to the predetermined inversion gates IG, depending on which global bit line GBL is selected. At the time of reading, the voltages of 0V and 5V are supplied to the predetermined inversion gates IG. At the time of writing, the inversion gate decoder 70 supplies enough voltage to the inversion gate $IG_2$ to weaken the channel formed between the source and the drain in the semiconductor substrate 11. At the time of writing, the inversion gate decoder 70 also supplies a voltage to the inversion gate $IG_0$ to cut the channel formed in the semiconductor substrate 11. The inversion gate $IG_0$ is located on the opposite side of the inversion gate $IG_1$ from the inversion gate $IG_2$.

Figure 13:
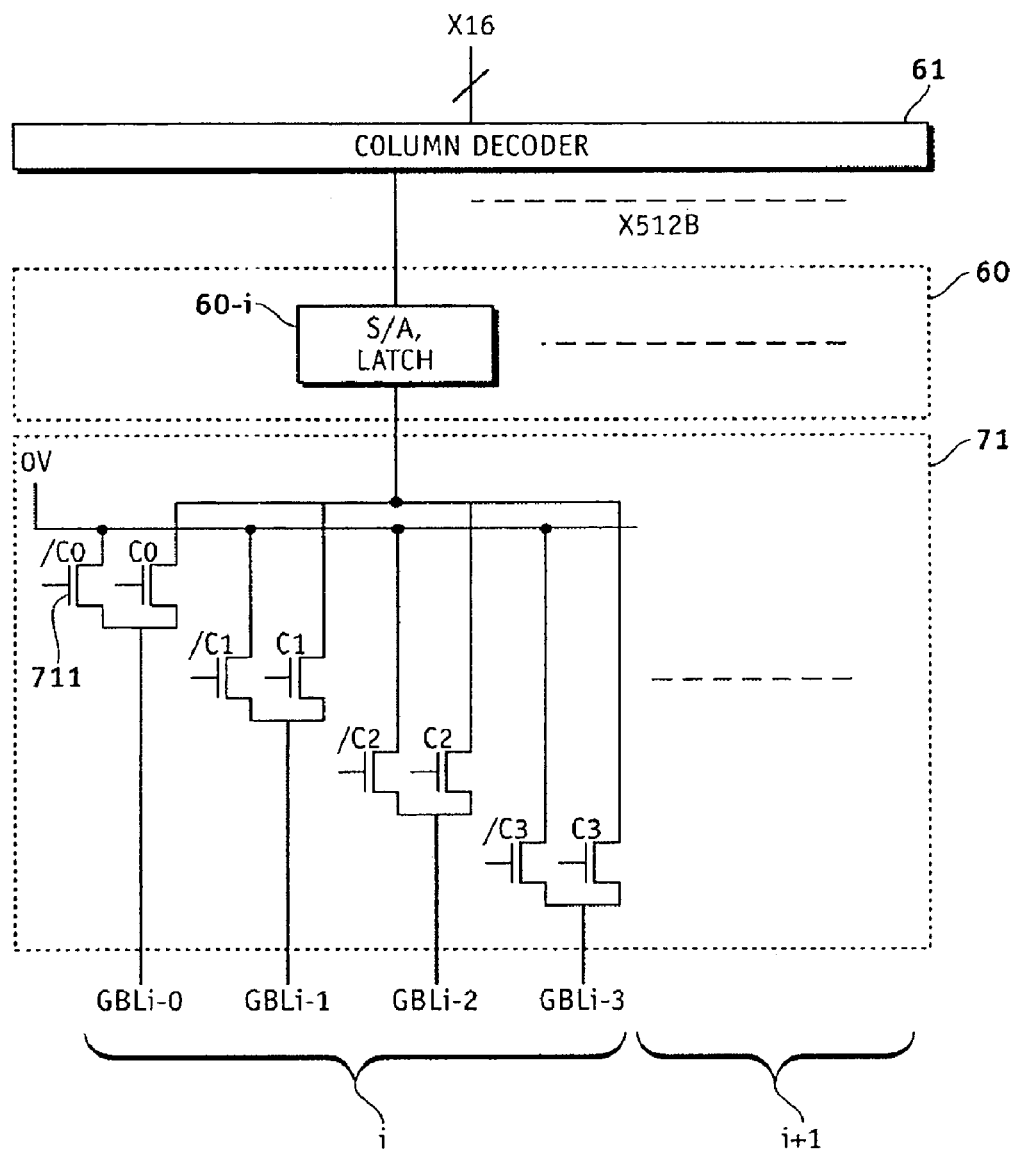
FIG. 13 is an enlarged view of the column decoder, the page buffer, the BL decoder and the global bit lines.

FIG. 13 is an enlarged view of the column decoder 61, the page buffer 60, the BL decoder 71, and the global bit lines GBL. The BL decoder 71 includes path transistors 711 that are controlled by signals C0, /C0 through C3, /C3 supplied from the address register 54 (FIG. 12). Global bit lines $GBL_{i-0}$ through $GBL_{i-3}$ form one set that is controlled by the select signals C0, /C0 through C3, /C3, and are connected to page buffer 60-$i$. At the time of reading, the select signal C2 is put to select level (High) and the global bit line $GBL_{i-2}$ is connected to the page buffer 60 so as to supply a read voltage of 1.5V. The select signal /C1 is then put to select level (High) and the global bit line $GBL_{i-1}$ is set at 0V, as shown in FIG. 7. At the time of writing, the select signal C3 is put to select level (High) and the global bit line $GBL_{i-3}$ is connected to the page buffer 60 so as to supply a write voltage of 4.5V. The select signal /C1 is then put to select level (High) and the global bit line $GBL_{i-1}$ is set at 0V, as shown in FIG. 6.

It should be noted that the structures of memory cells are not limited to those of the above embodiments. Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   a semiconductor substrate;
   word lines;
   global bit lines;
   inversion gates formed on the semiconductor substrate, wherein the inversion gates form inversion layers serving as local bit lines in the semiconductor substrate, the inversion layers being electrically connected to the global bit lines;
   an oxide-nitride-oxide (ONO) layer overlying the inversion gates and the semiconductor substrate, wherein a nitride layer of the ONO layer is an insulating layer; and
   a memory cell formed between adjacent inversion gates and using the inversion layers as a source and a drain, the memory cell storing two bits, one bit stored on either side of a portion of the nitride layer that is interposed between adjacent inversion gates.

2. The semiconductor device as claimed in claim 1, wherein the inversion layers are connected to the global bit lines via metal interconnections.

3. The semiconductor device as claimed in claim 1, further comprising
   a select circuit that supplies the inversion gates with a given voltage for programming or erasing the memory cell.

4. The semiconductor device as claimed in claim 1, wherein the inversion gates include a first inversion gate forming an inversion layer serving as the source, a second inversion gate forming an inversion layer serving as the drain, and a third inversion gate provided between the first and second inversion gates,
   the semiconductor device further comprising
   a select circuit that supplies, at the time of writing, the first through third inversion gates with predetermined voltages so that a memory cell to be subjected to writing can be selected.

5. The semiconductor device as claimed in claim 4, wherein the select circuit supplies the third inversion gate, at the time of writing, with a first predetermined write voltage to weaken a channel formed between the source and drain in the semiconductor substrate.

6. The semiconductor device as claimed in claim 4, wherein:
   the inversion gates further include a fourth inversion gate that is provided on the semiconductor substrate at a side of the first inversion gate opposite to a side thereof at which the third inversion gate is provided; and
   wherein the select circuit supplies the fourth inversion gate, at the time of writing, with a second predetermined write voltage that cuts a channel formed in the semiconductor substrate.

7. The semiconductor device as claimed in claim 1, further comprising
   a write voltage supply circuit that supplies the inversion layers, at the time of writing, with predetermined voltages for writing.

8. The semiconductor device as claimed in claim 1, further comprising
   a voltage supply circuit that supplies the inversion layers and a word line, at the time of erasing, with predetermined voltages for drawing out electrons injected in the memory cell to the semiconductor substrate by virtue of a Fowler-Nordheim (FN) tunneling effect.

9. The semiconductor device as claimed in claim 1, further comprising
   a voltage supply circuit that supplies a word line, at the time of erasing, with a predetermined erase voltage for drawing out electrons injected in the memory cell to the word line by virtue of an FN tunneling effect.

10. The semiconductor device as claimed in claim 1, further comprising a voltage supply circuit that supplies the inversion gates and a word line, at the time of erasing, with predetermined voltages for drawing out electrons injected in the memory cell to the inversion gates by virtue of an FN tunneling effect.

11. The semiconductor device as claimed in claim 1, further comprising:
    column sets that include the global bit lines; and
    a decoder connecting a given global bit line in each of the column sets to a respective page buffer via a common select signal line.

12. The semiconductor device as claimed in claim 1, wherein the inversion layers are shared by multiple memory cells.

13. The semiconductor device as claimed in claim 1, wherein the memory cell is a SONOS type memory cell.

14. The semiconductor device as claimed in claim 1, wherein the semiconductor device is a semiconductor memory device.

15. A method in a semiconductor device including a memory cell comprising the steps of:
    forming inversion layers serving as local bit lines in a semiconductor substrate, wherein the inversion layers include a first inversion gate forming an inversion layer serving as a source, a second inversion gate forming an inversion layer serving as a drain, and a third inversion gate provided between the first and second inversion gates;
    electrically connecting the inversion layers to global bit lines;
    selecting a word line; and
    writing to the memory cell by programming one or more of two portions of a nitride layer located at either side of the third inversion gate, wherein the nitride layer is a middle layer of an oxide-nitride-oxide (ONO) layer which overlays the first, second and third inversion gates and the semiconductor substrate, and wherein each of the two portions of the nitride layer stores one bit.

16. The method as claimed in claim 15, wherein:
    the step of forming comprises supplying the first through third inversion gates, at the time of writing, with predetermined voltages so that the memory cell can be selected.

17. The method as claimed in claim 16, wherein the step of forming further comprises supplying the third inversion gate, at the time of writing, with a first predetermined write voltage to weaken a channel formed between the source and drain in the semiconductor substrate.

18. The method as claimed in claim 16, wherein:
    the inversion gates further comprise a fourth inversion gate that is provided at a side of the first inversion gate opposite to a side thereof at which the third inversion gate is provided, and
    wherein the step of forming further comprises supplying the fourth inversion gate, at the time of writing, with a second predetermined write voltage that cuts a channel formed in the semiconductor substrate.

19. The method as claimed in claim 15, further comprising the step of supplying the inversion layers, at the time of writing, with a third predetermined write voltage via the global bit lines.

20. The method as claimed in claim 15, further comprising the step of supplying the inversion layers and a word line, at a time of erasing, with predetermined voltages for drawing out electrons injected in the memory cell to the semiconductor substrate by virtue of a Fowler-Nordheim (FN) tunneling effect.

* * * * *